United States Patent
Tsung-Chih

[19]

[11] Patent Number: 6,037,214
[45] Date of Patent: Mar. 14, 2000

[54] METHOD OF FABRICATING A CAPACITOR

[75] Inventor: Wu Tsung-Chih, Hsinchu-Hsien, Taiwan

[73] Assignee: United Microelectronics Corp., Hsinchu, Taiwan

[21] Appl. No.: 09/112,932

[22] Filed: Jul. 9, 1998

[30] Foreign Application Priority Data

May 2, 1998 [TW] Taiwan .................................. 87106798

[51] Int. Cl.⁷ ............................................... H01L 21/8242
[52] U.S. Cl. ........................................... 438/253; 438/254
[58] Field of Search .................................... 438/238–241, 438/250–256, 381, 393–399

[56] References Cited

U.S. PATENT DOCUMENTS 5,444,005  8/1995  Kim et al. .
5,663,085  9/1997  Tanigawa ................................. 438/255

*Primary Examiner*—Jey Tsai
*Attorney, Agent, or Firm*—Thomas, Kayden, Horstemeyer & Risley

[57] ABSTRACT

A method for fabricating a capacitor of a memory cell in a dynamic random access memory, including forming a branch-like lower electrode, a dielectric film, and a upper electrode. The lower electrode consists of a cylindrical structure and horizontally extended outward conducting branches. This branch-like lower electrode efficiently increases the permittivity of the capacitor by increasing the surface of the electrode.

10 Claims, 8 Drawing Sheets

METHOD OF FABRICATING A CAPACITOR

CROSS-REFERENCE TO RELATED APPLICATION

This application claims the priority benefit of Taiwan application serial no. 87106798, filed May 2, 1998, the full disclosure of which is incorporated herein by reference.

BACKGROUND OF THE INVENTION

1. Field of the Invention

This invention relates to a method of fabricating a capacitor, and more particularly, to a method of fabricating a capacitor having a number of insulating layers interlacing with a number of conducting layer for a dynamic random access memory (DRAM).

2. Description of Related Art

Because microprocessors have become more and more powerful, and the structures and required algorithms of software applications have become more and more complicated, requirements on memory capacities have been increased as well. The current DRAM cell consists of a transfer field effect transistor (TEFT) and a storage transistor.

As shown in FIG. 1, a capacitor C of the array of capacitors on a semiconductor substrate is used to store information by charging and discharging the capacitor C. Normally, a binary 0 is stored in a capacitor if the capacitor is not charged, and a binary 1 is stored if the capacitor is charged. Dielectric material 102 is filled into the space between the lower electrode 100 and the upper electrode 101 of the capacitor C to provide a necessary permittivity. The capacitor C is electrically connected to a bit line BL, so that information can be read or written through the bit line BL by charging or discharging the capacitor C. The task of charging or discharging the capacitor C is controlled and executed through a TFET, T, which has connections from the drain to the bit line BL, from the source to the capacitor C, and from the gate to the word line WL. Signals are fed into the TFET T through the word line to control the connection between the capacitor C and the bit line BL.

In a conventional fabrication process of a DRAM of less than 1 megabyte in capacity, the capacitors are normally made in a two-dimension form, a so-called planar-type capacitor. Since a conventional planar-type capacitor requires a relatively large area for storing charges, it is not suitable for the fabrication of a DRAM with high integration, such as a DRAM of larger than 4 megabytes in capacity. For the fabrication of a highly integrated DRAM, a capacitor with a three dimensional design, such as a stacked capacitor or a trench-type capacitor, is required.

Even though a typical three dimensional capacitor, such as a stacked capacitor or a trench-type capacitor, stores more charges than a conventional planar-type capacitor, that is, it has a larger permittivity, by occupying less area on the semiconductor substrate, such a design does not meet the requirement of DRAM of a still higher capacity, such as 64 megabytes.

It is obvious that downsizing a memory cell that contains the storage capacitor leads to a decrease in the permittivity of the storage capacitor. And, the decreasing of the permittivity of the storage capacitor increases the possibility of the occurrence of soft errors due to the incident α ray as well.

In order to solve the foregoing problems, the electrode and the dielectric layer of a capacitor can be extended horizontally, and stacked vertically to form a so-called fin-type capacitor. So, the permittivity of the capacitor is increased according to the increment of the surface area of the capacitor electrode.

The foregoing problems can also be resolved by extending the electrode and the dielectric layer of a capacitor vertically to form a so-called cylindrical-type capacitor. The permittivity of the capacitor is also increased according to the increment of the surface area of the capacitor electrode.

Since the integration of DRAM keeps increasing and a DRAM cell has to be accordingly downsized, manufacturers are still looking for a fabricating method and structure of a DRAM in order to downsize the DRAM cell, and in the meantime, retain the permittivity of a storage capacitor as well.

SUMMARY OF THE INVENTION

It is therefore an objective of the present invention to provide a method for fabricating a capacitor including forming a silicon nitride layer over a semiconductor substrate having partial DRAM structure formed thereon, and forming a stacked structure by interlacing conducting layers and insulating layers in sequence. Then, by using photoresist layers as masks, a part of the stacked structure is patterned and removed to expose a part of the substrate. A conducting layer is next formed on the stacked structure and electrically connected to the exposed substrate.

The conducting layer is then patterned by another photoresist layer to form a step-like conducting layer. A silicon nitride spacer is formed on the side of the step-like conducting layer, and is used as a mask in an etching process to form a cylindrical structure and expose the top layer of the stacked structure. The etching process also removes the exposed part of the underlying stacked structure and exposes the silicon nitride layer. The stacked structure under the cylindrical structure remains. Next, the silicon nitride layer and the insulating layers of the stacked structure are removed. The cylindrical structure and the conducting layers of the stacked structure now form a branch-like lower electrode. The fabrication process of a capacitor is then completed after a dielectric layer and an upper electrode are formed on the branch-like lower electrode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating a storage capacitor of a memory cell in a DRAM.

Figure 1:
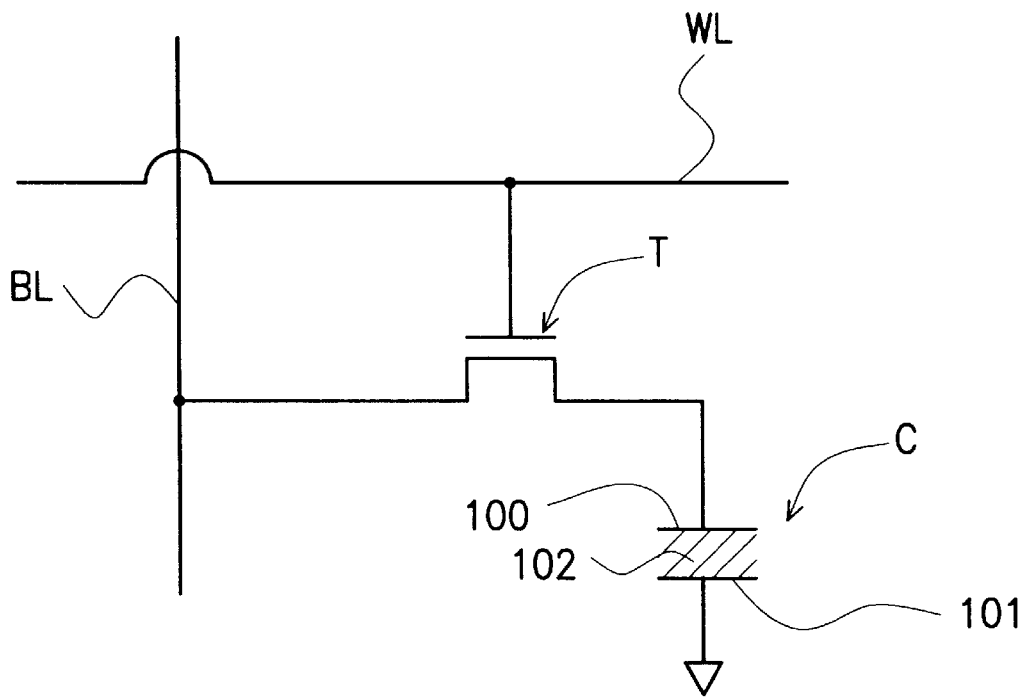
FIG. 1 is a schematic diagram showing a circuit of a memory cell in a conventional DRAM.
Figure 2A:
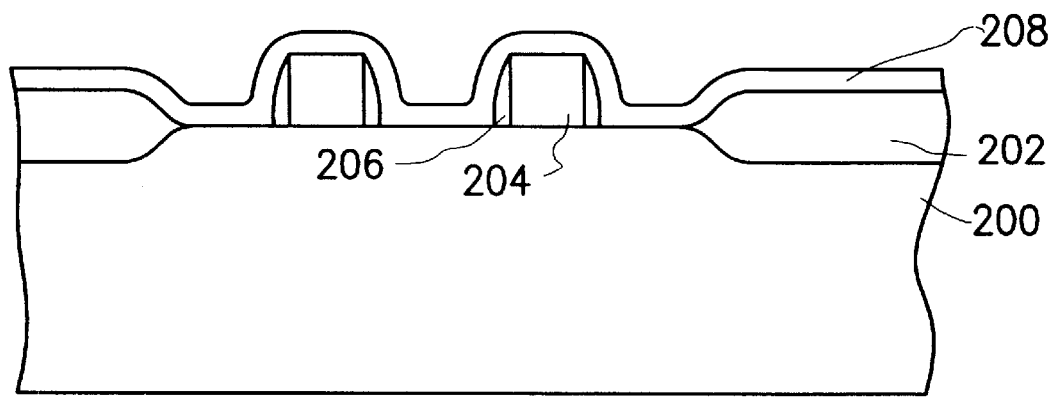
FIGS. 2A through 2M are cross-sectional views showing the fabrication process of a storage capacitor in a preferred embodiment according to the invention.

Referring to FIG. 2A, a semiconductor substrate 200 has a pre-formed field oxide 202, and a field effect transistor consisting of a gate structure 204 and a spacer 206. The gate structure 204 further consists of a gate oxide layer with a thickness of about 100 Å, a polysilicon layer with a thickness of about 1000 Å, and a tungsten sulicide layer with a thickness of about 1000 Å. A first insulating layer 208, such as a first oxide layer, with a thickness of about 2000 Å is formed on the substrate 200 in a process such as chemical vapor deposition.

Figure 2B:
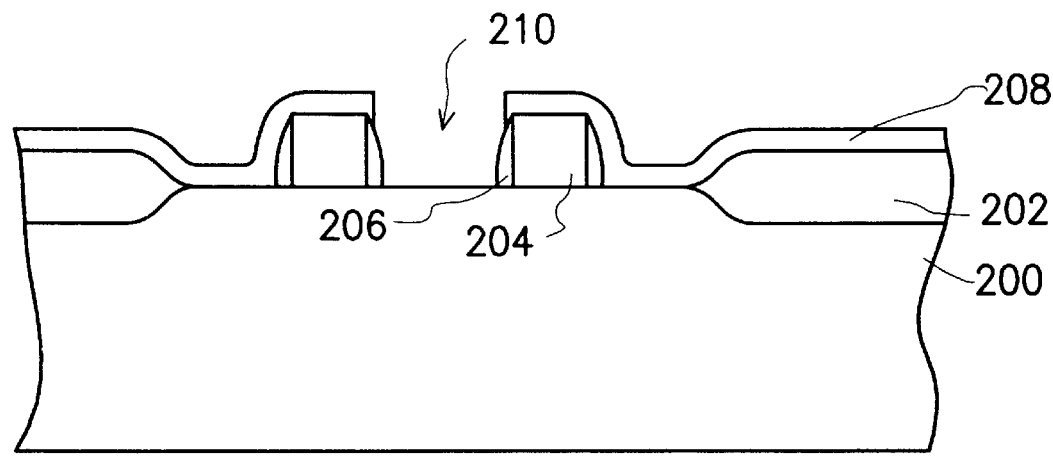

Referring next to FIG. 2B, the first insulating layer 208 is patterned by performing a photolithography process to form an opening 210 to expose a part of the substrate 200.

Figure 2C:
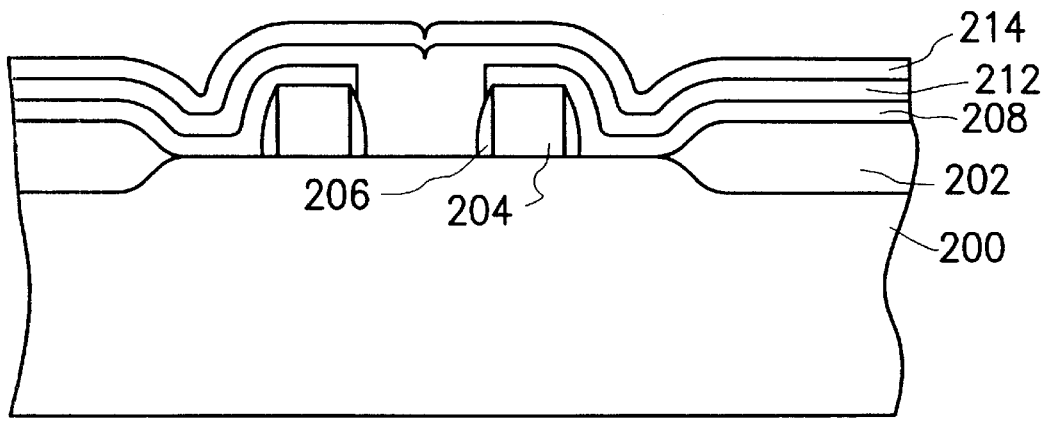

Referring to FIG. 2C, a first conducting layer 212, such as a first polysilicon layer, is formed on the substrate 200 and fills the opening 210, and then a tungsten silicide layer 214 is formed on the first conducting layer 212. The thickness of the first conducting layer 212 is about 1000 Å, and the thickness of the tungsten silicide layer 214 is about 1000 Å.

Figure 2D:
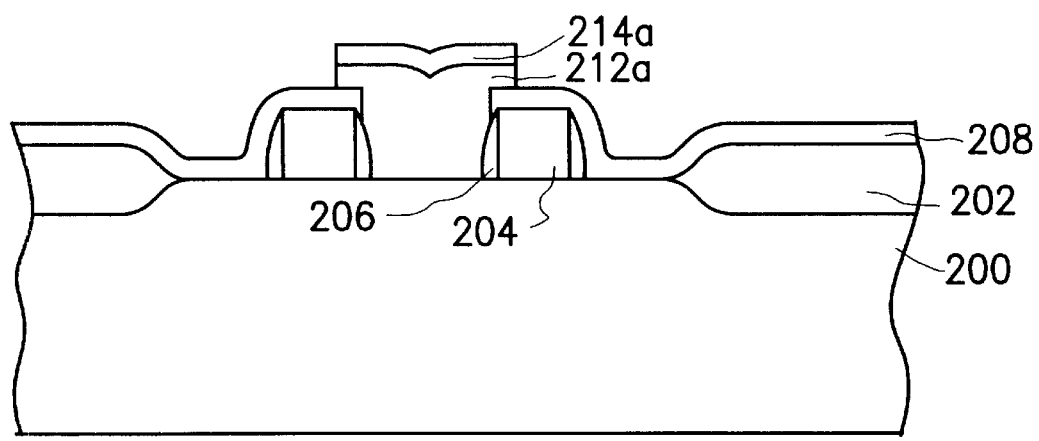

Referring next to FIG. 2D, a photolithography process is performed to expose the first insulating layer 208. A part of the tungsten silicide layer 214, labeled 214a, and a part of the first conducting layer 212, labeled 212a, above the opening 210, as shown in FIG. 2B, remain.

Figure 2E:
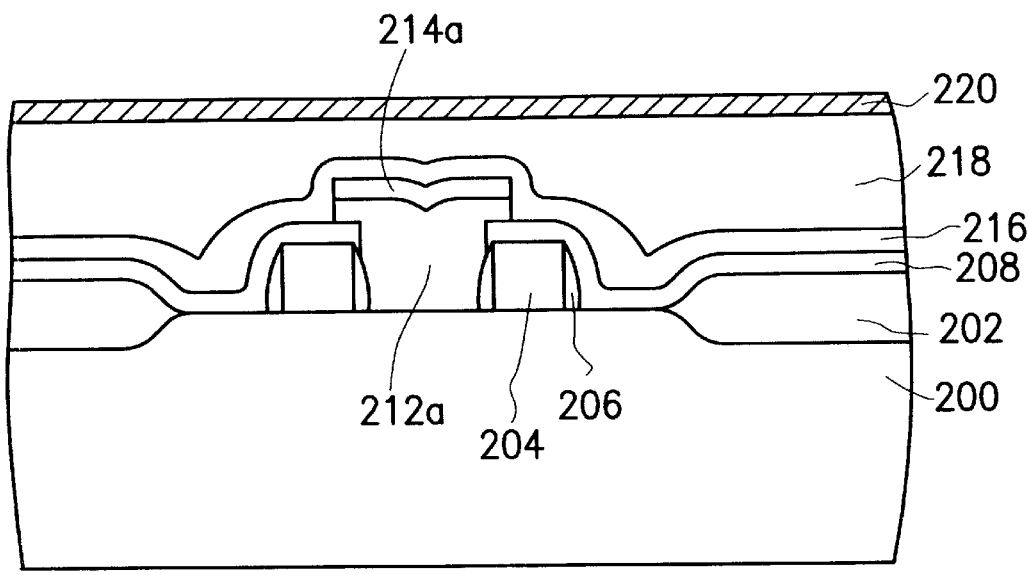

Referring to FIG. 2E, a polysilicon layer 216, with a thickness of about 2000 Å, is formed on the substrate 200 by atmospheric pressure chemical vapor deposition (APCVD). A borophosphosilicate (BPSG) layer 218 with a thickness of 7500 Å is next formed on the polysilicon layer 216, is planarized into a layer with a thickness of about 4000A in a flow process with a temperature of 850° C., and then is etched back. A silicon nitride layer 220 with a thickness of about 1000 Å is then formed on the BPSG layer 218.

Figure 2F:
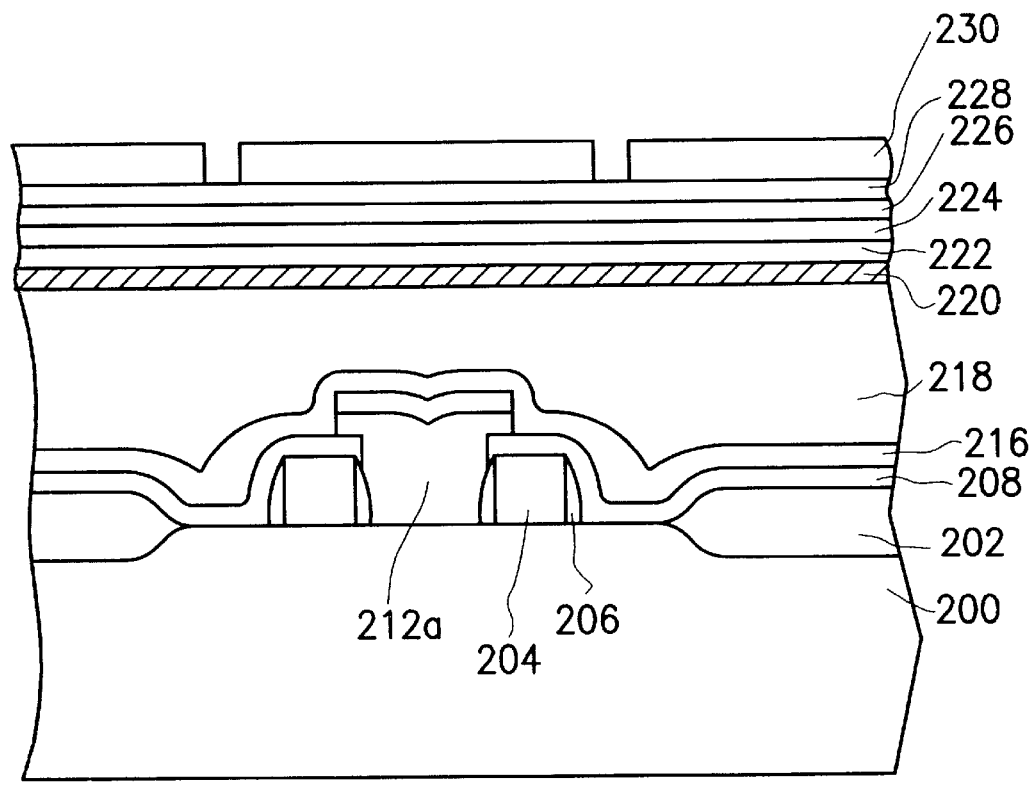

Referring to FIG. 2F, a second conducting layer 222, such as a second polysilicon layer, a second insulating layer 224, such as a second oxide layer, a third conducting layer 226, such as a third polysilicon layer, and a third insulating layer 228, such as a third oxide layer, all with the same thickness of about 1000 Å are formed in sequence on silicon nitride 220. A first photoresist layer 230 is next formed on the third insulating layer 228, and is patterned corresponding to the conducting regions (not shown) on the substrate 200.

Figure 2G:
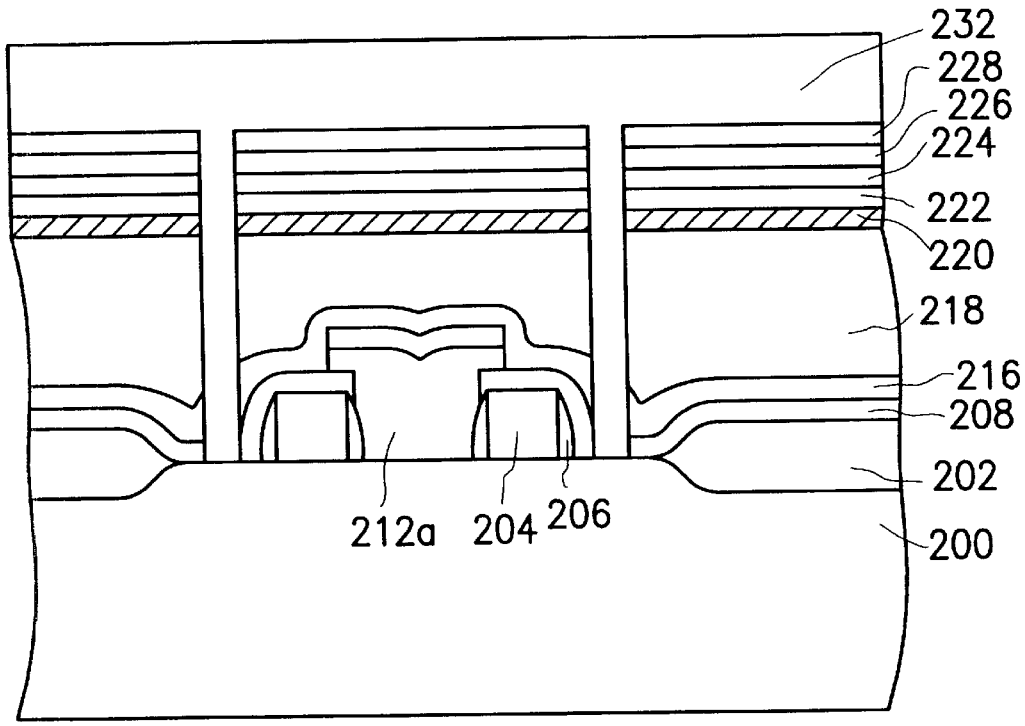

Referring to FIG. 2G, using the first photoresist layer 230 as a mask, photolithography processes are performed on the structure beneath the first photoresist layer 230 to expose the substrate 200. A fourth conducting layer 232, such as a fourth polysilicon layer, with a thickness of about 8000 Å is formed on the third insulating layer 228 and fills the etched openings to form electrical connections with the conducting regions on the substrate 200 after the removal of the first photoresist layer.

Figure 2H:
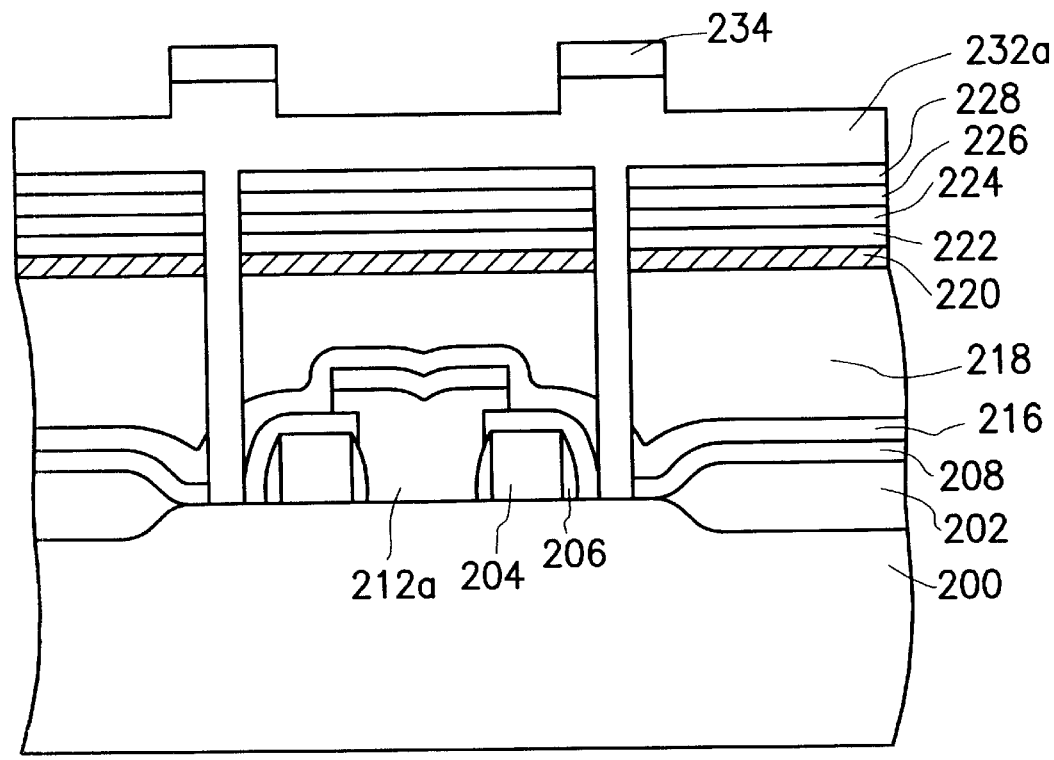

Next, referring to FIG. 2H, a patterned second photoresist layer 234 is formed on the fourth conducting layer 232, and is used as a mask to perform an etching process on the fourth conducting layer 232. The pattern on the second photoresist layer 234 matches the positions of those electrical connections between the fourth conducting layer 232 and the substrate 200. after the etching process, the fourth conducting layer 232 is turned into a step-like fourth conducting layer 232a.

Figure 2I:
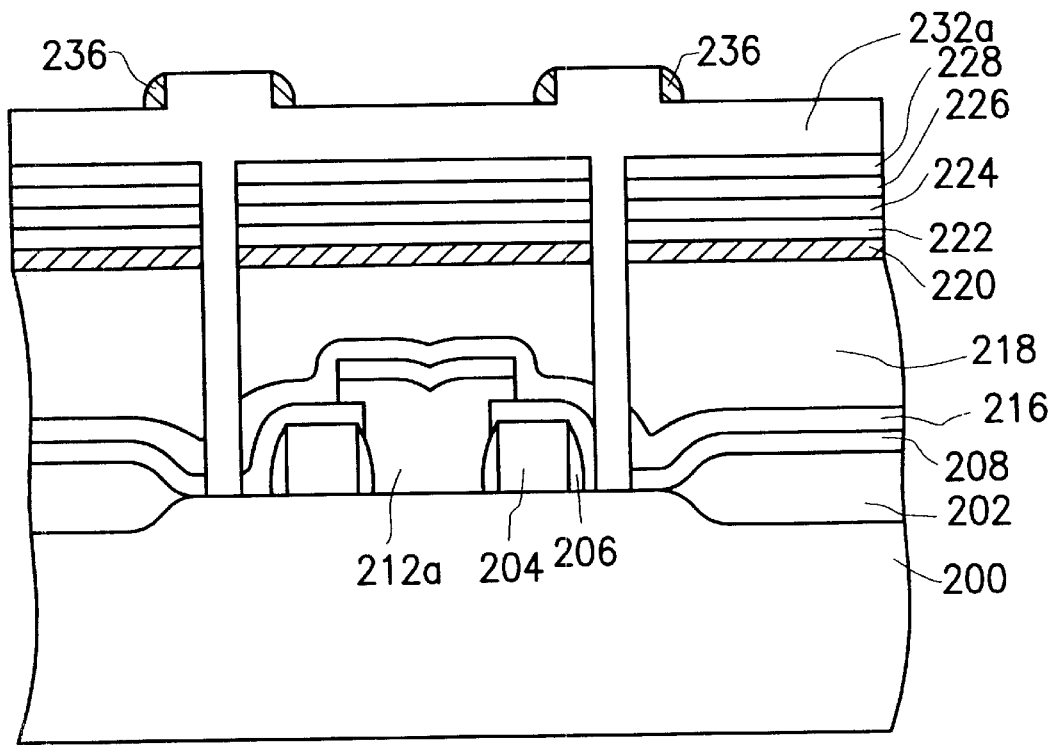

Referring to FIG. 2I, spacers 236 are formed around the step-like fourth conducting layer 232a. The process of forming the spacers 236 includes forming a silicon nitride layer with a thickness of 2500 Å on the step-like fourth conducting layer 232a, and removing some of the formed silicon nitride with an etching back process.

Figure 2J:
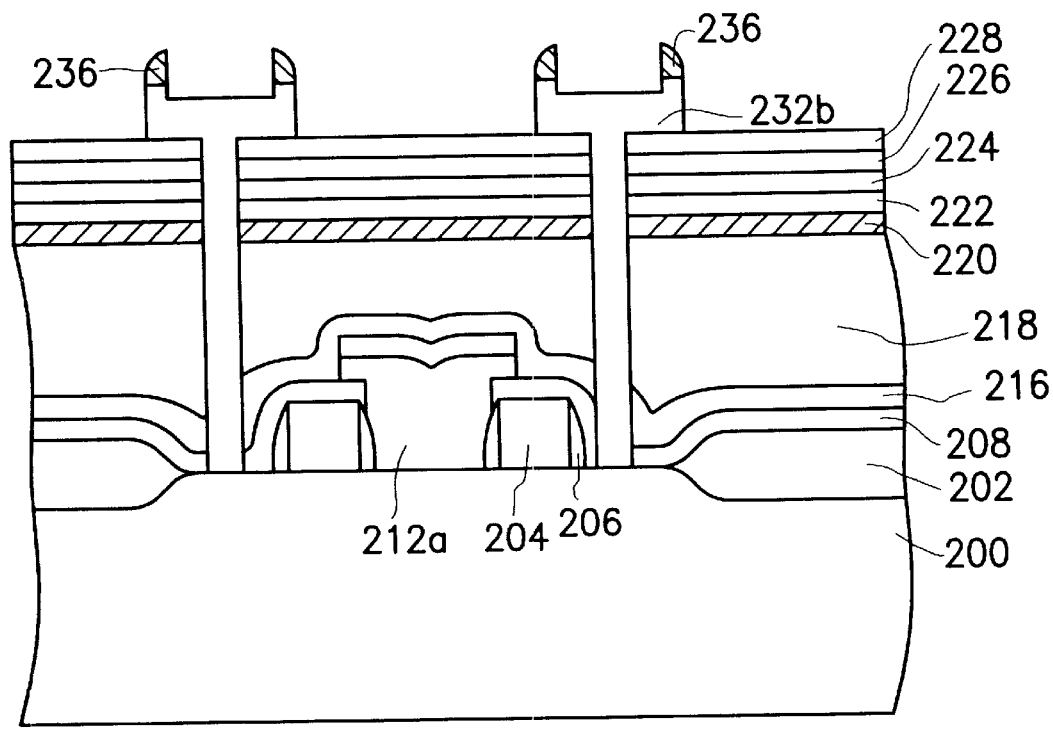

Referring next to FIG. 2J, an etching process is performed on the step-like fourth conducting layer using the spacers 236 as masks to expose the third insulating layer 228. The remaining fourth conducting layer 232 is now a cylindrical structure 232b.

Figure 2K:
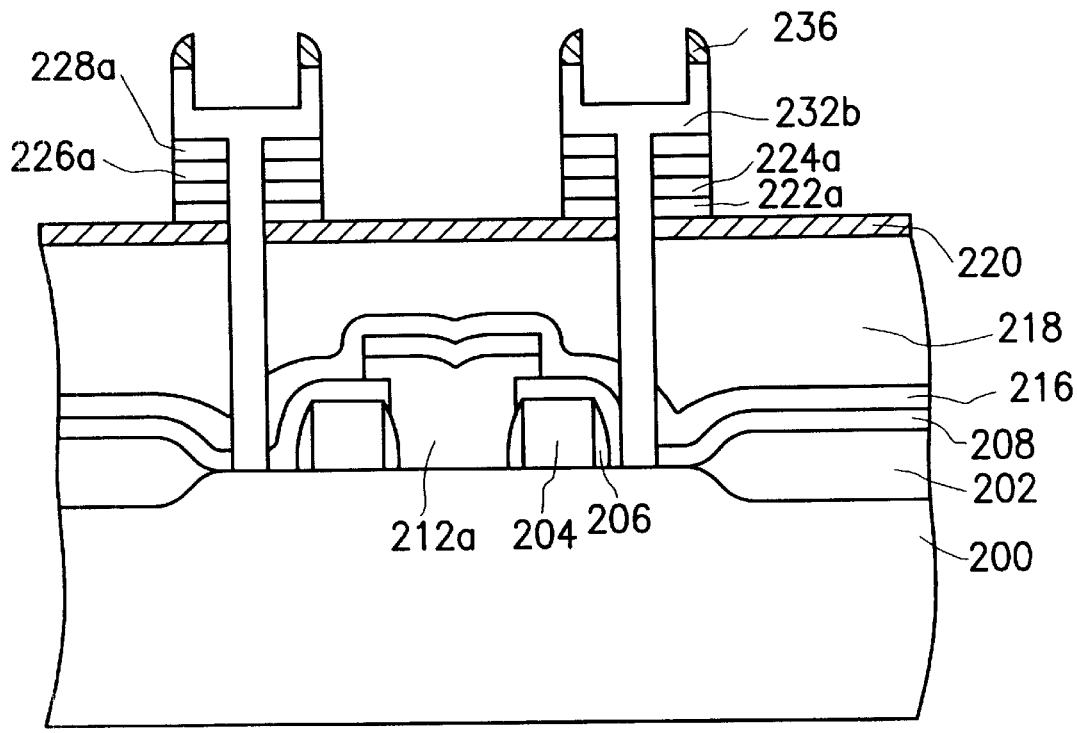

Referring next to FIG. 2K, the exposed portion of the insulating layer 228 and the underlying structure are removed with an anti-isotropic etching process to expose the silicon nitride layer 220. Everything vertically under the cylindrical structure 232b remains.

Figure 2L:
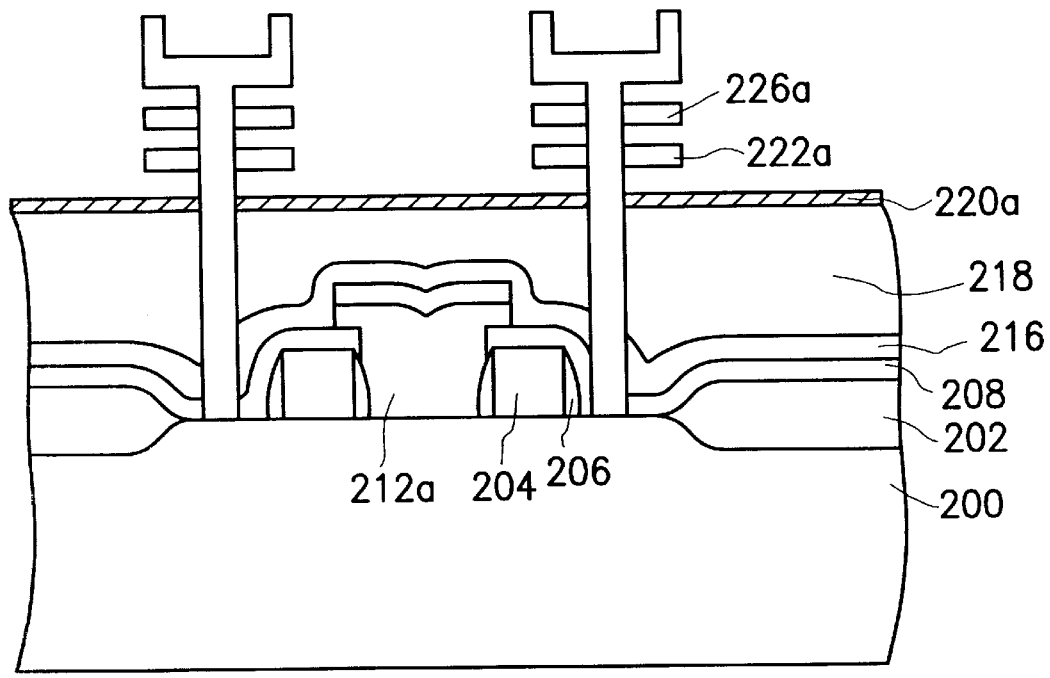

Referring to FIG. 2L, The spacers 236, the remaining third insulating layer 228a, the remaining second insulating layer 224a, and a part of the silicon nitride layer 220 are removed with an anti-isotropic selective etching process. A branch-like lower electrode of a capacitor is now formed above the remaining silicon nitride layer 220a, wherein the branch-like lower electrode consists of the cylindrical structure 232b, the horizontally and outward extended second conducting layers 222a and third conducting layers 224a.

Figure 2M:
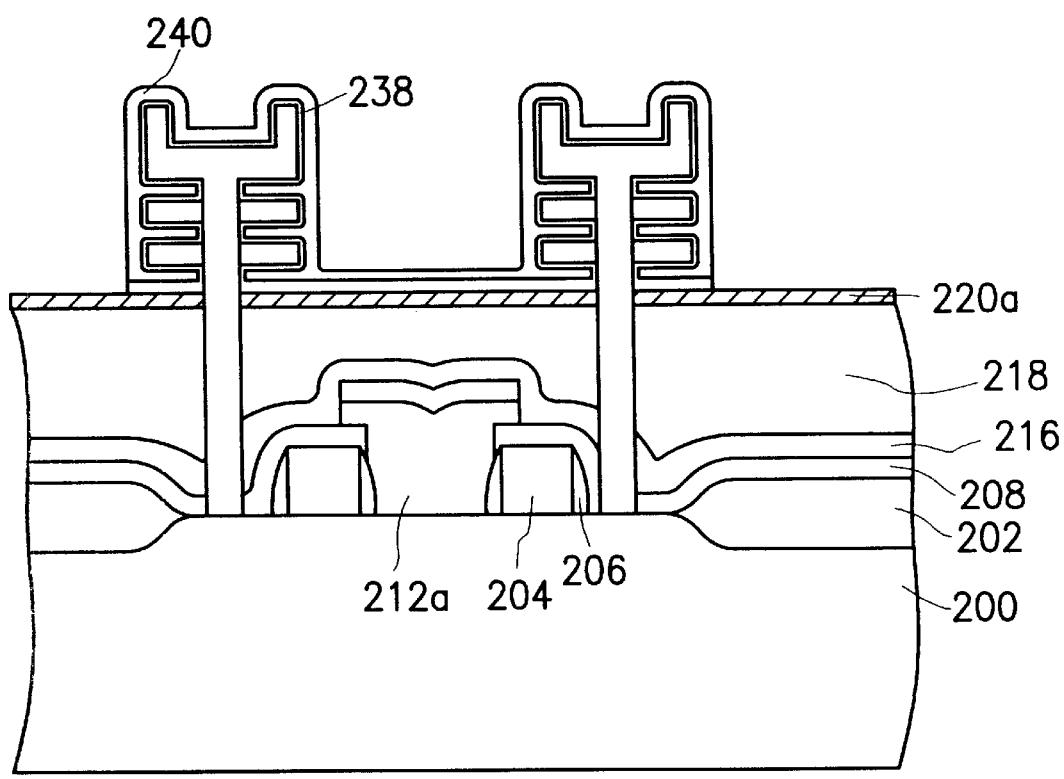

Next, referring to FIG. 2M, a dielectric film 238, such as a silicon oxide/silicon nitride/silicon oxide (ONO) structure, with a thickness of about 60 Å, is formed to cover the entire lower electrode. And then, a fifth conducting layer 240, such as a fifth polysilicon layer, is formed on the dielectric film 238 and constitutes the upper electrode of the capacitor.

The embodiment according to the invention can be used in the fabrication of a capacitor over bit-line (COB) or a capacitor under bit-line (CUB).

Therefore, it is a specificity of the invention to form a branch-like lower electrode of a capacitor used in a memory cell. The branch-like lower electrode consists of an upward cylindrical structure with a cup-shaped top, and horizontally and outward extended branches on the side of the cylindrical structure. The lower electrode according to the invention contains an increased surface area, which improves the permittivity of a capacitor, and occupies a small surface area on the semiconductor substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor, the method comprising:
   providing a substrate;
   forming a silicon nitride layer on the substrate;
   forming a first conducting layer on the silicon nitride layer,
   forming a first insulating layer on the first conducting layer;
   forming a second conducting layer on the first insulating layer;
   forming a second insulating layer on the second conducting layer;
   performing an etching process on the first conducting layer, the first insulating layer, the second conducting layer, and the second insulating layer to expose the substrate;
   forming a third conducting layer over the second insulating layer, wherein the third conducting layer is electrically connected to the substrate;
   removing a portion of the third conducting layer to form a step-like third conducting layer;
   forming a spacer on the side of the step-like third conducting layer;
   removing a portion of the step-like third conducting layer by using the spacer as an etching mask to form a cylindrical structure and expose the second insulating layer, removing the exposed second insulating layer, the second conducting layer, the first insulating layer, and the first conducting layer to expose the silicon nitride layer;

removing the first insulating layer, the second insulating layer, and a portion of the silicon nitride layer, wherein the cylindrical structure, the first conducting layer and the second conducting layer form a lower electrode;

forming a dielectric film on the lower electrode; and forming an upper electrode on the dielectric film.

2. The method of claim 1, wherein the first conducting layer, the second conducting layer, and the third conducting layer include polysilicon.

3. The method of claim 2, wherein the first conducting layer and the second conducting layer each have a thickness of about 8000 Å.

4. The method of claim 2, wherein the third conducting layer has a thickness of about 8000 Å.

5. The method of claim 1, wherein the first insulating layer and the second insulating layer include oxide.

6. The method of claim 5, wherein the first insulating layer and the second insulating layer each have a thickness of about 1000 Å.

7. The method of claim 1, wherein the step of forming the spacer further comprises:

forming a second silicon nitride layer on the step-like third conducting layer; and removing a portion of the second silicon nitride layer by performing an etching back process.

8. The method of claim 7, wherein the second silicon nitride layer has a thickness of about 2500 Å.

9. The method of claim 1, wherein the dielectric film has a thickness of about 60 Å.

10. The method of claim 1, wherein the upper electrode is a fourth conducting layer.

* * * * *